(12) United States Patent
Wang et al.

(10) Patent No.: US 9,349,657 B2
(45) Date of Patent: May 24, 2016

(54) FABRICATION METHODS OF INTEGRATED SEMICONDUCTOR STRUCTURE

(75) Inventors: Sheng-Hsiung Wang, Zhubei (TW);
Hsien-Chin Lin, Hsinchu (TW);
Yuan-Ching Peng, Hsinchu (TW);
Chia-Pin Lin, Xinpu Township (TW);
Fan-Yi Hsu, Toufen Town (TW);
Ya-Jou Hsieh, Xizhou Township (TW)

(73) Assignee: TAIWAN SEMICONDUCTOR MANUFACTURING COMPANY, LTD. (TW)

(*) Notice: Subject to any disclaimer, the term of this patent is extended or adjusted under 35 U.S.C. 154(b) by 785 days.

(21) Appl. No.: 13/162,813

(22) Filed: Jun. 17, 2011

(65) Prior Publication Data

US 2012/0322246 A1 Dec. 20, 2012

(51) Int. Cl.
| | |
|---|---|
| *C23C 16/24* | (2006.01) |
| *H01L 21/20* | (2006.01) |
| *H01L 21/36* | (2006.01) |
| *H01L 21/8238* | (2006.01) |
| *H01L 29/66* | (2006.01) |
| *H01L 21/3205* | (2006.01) |
| *H01L 21/4763* | (2006.01) |
| *H01L 21/311* | (2006.01) |

(52) U.S. Cl.
CPC ...... *H01L 21/823857* (2013.01); *H01L 21/823842* (2013.01); *H01L 29/66545* (2013.01)

(58) Field of Classification Search
None
See application file for complete search history.

(56) References Cited

U.S. PATENT DOCUMENTS

| | | | | |
|---|---|---|---|---|
| 2005/0001267 | A1* | 1/2005 | Miyagawa et al. | 257/332 |
| 2005/0272191 | A1* | 12/2005 | Shah et al. | 438/197 |
| 2008/0182396 | A1* | 7/2008 | Kobayashi et al. | 438/589 |
| 2008/0207000 | A1* | 8/2008 | Chou et al. | 438/701 |
| 2012/0225545 | A1* | 9/2012 | Fu et al. | 438/585 |

* cited by examiner

*Primary Examiner* — Calvin Choi
(74) *Attorney, Agent, or Firm* — Hauptman Ham, LLP

(57) ABSTRACT

A method for manufacturing the integrated circuit device including, providing a substrate having a first region and a second region. Forming a dielectric layer over the substrate in the first region and the second region. Forming a sacrificial gate layer over the dielectric layer. Patterning the sacrificial gate layer and the dielectric layer to form gate stacks in the first and second regions. Forming an ILD layer within the gate stacks in the first and second regions. Removing the sacrificial gate layer in the first and second regions. Forming a protector over the dielectric layer in the first region; and thereafter removing the dielectric layer in the second region.

20 Claims, 11 Drawing Sheets

FABRICATION METHODS OF INTEGRATED SEMICONDUCTOR STRUCTURE

TECHNICAL FIELD

The present disclosure relates generally to the field of semiconductor devices, and more particularly, to metal gate transistors, integrated circuits, systems, and fabrication methods thereof.

BACKGROUND

The semiconductor integrated circuit (IC) industry has experienced rapid growth. Technological advances in IC materials and design have produced generations of ICs where each generation has smaller and more complex circuits than the previous generation. However, these advances have increased the complexity of processing and manufacturing ICs and, for these advances to be realized, similar developments in IC processing and manufacturing are needed.

In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling-down also produces a relatively high power dissipation value, which may be addressed by using low power dissipation devices such as complementary metal-oxide-semiconductor (CMOS) devices.

During the scaling trend, various materials have been implemented for the gate electrode and gate dielectric for CMOS devices. CMOS devices have typically been formed with a gate oxide and polysilicon gate electrode. There has been a desire to replace the gate oxide and polysilicon gate electrode with a high-k gate dielectric and metal gate electrode to improve device performance as feature sizes continue to decrease.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

Figure 1:
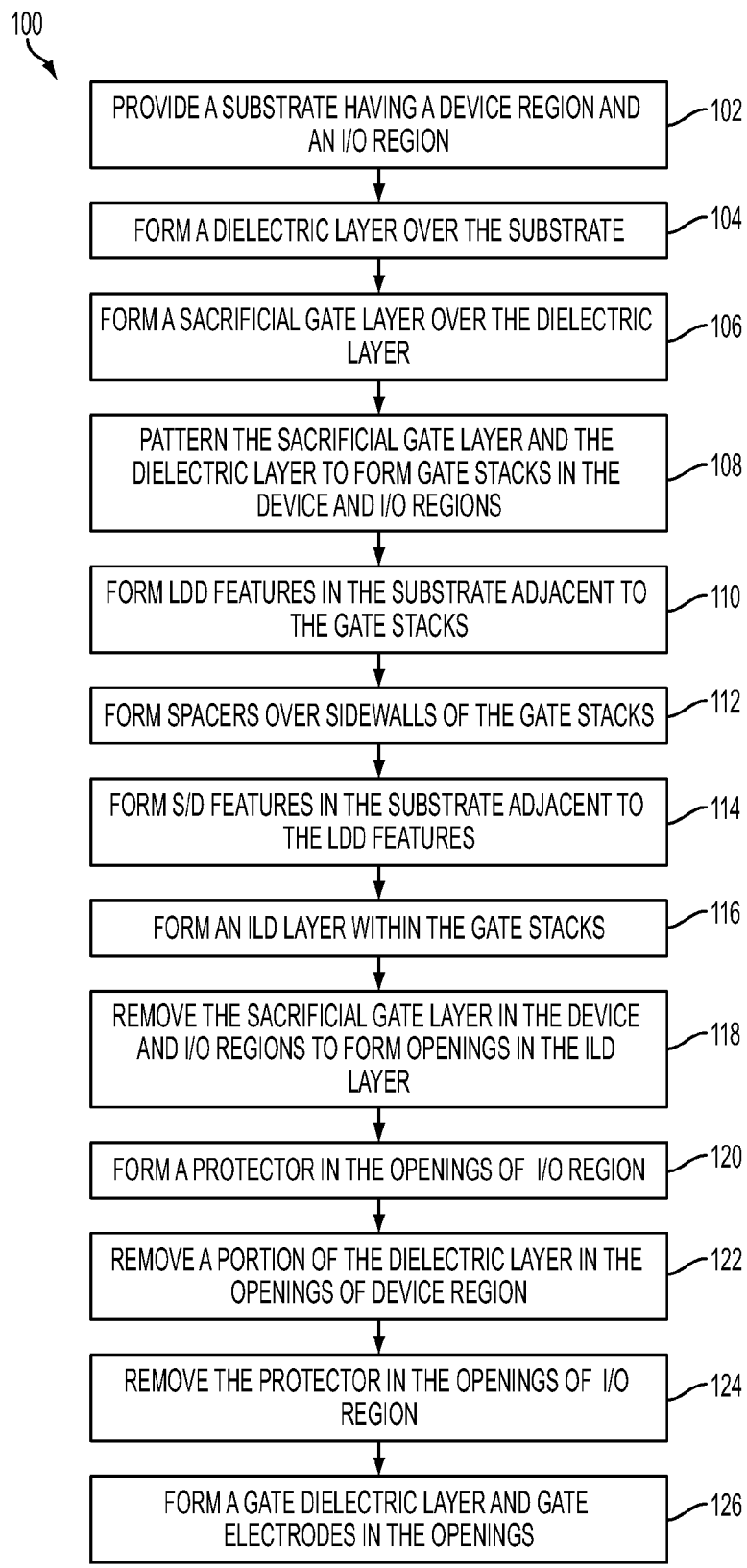
FIG. 1 is a flow chart of a method for fabricating an integrated circuit device according to an embodiment of the present disclosure.

It is understood that the following disclosure provides many different embodiments, or examples, for implementing different features of the disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

With reference to FIGS. 1 and 2-11, a method 100 and a semiconductor device 200 are collectively described below. The semiconductor device 200 illustrates an integrated circuit, or portion thereof, that can comprise memory cells and/or logic circuits. The semiconductor device 200 can include passive components such as resistors, capacitors, inductors, and/or fuses; and active components, such as P-channel field effect transistors (PFETs), N-channel field effect transistors (NFETs), metal-oxide-semiconductor field effect transistors (MOSFETs), complementary metal-oxide-semiconductor transistors (CMOSs), high voltage transistors, and/or high frequency transistors, other suitable components, and/or combinations thereof. It is understood that additional steps can be provided before, during, and/or after the method 100, and some of the steps described below can be replaced or eliminated, for additional embodiments of the method. It is further understood that additional features can be added in the semiconductor device 200, and some of the features described below can be replaced or eliminated, for additional embodiments of the semiconductor device 200.

Figure 2:
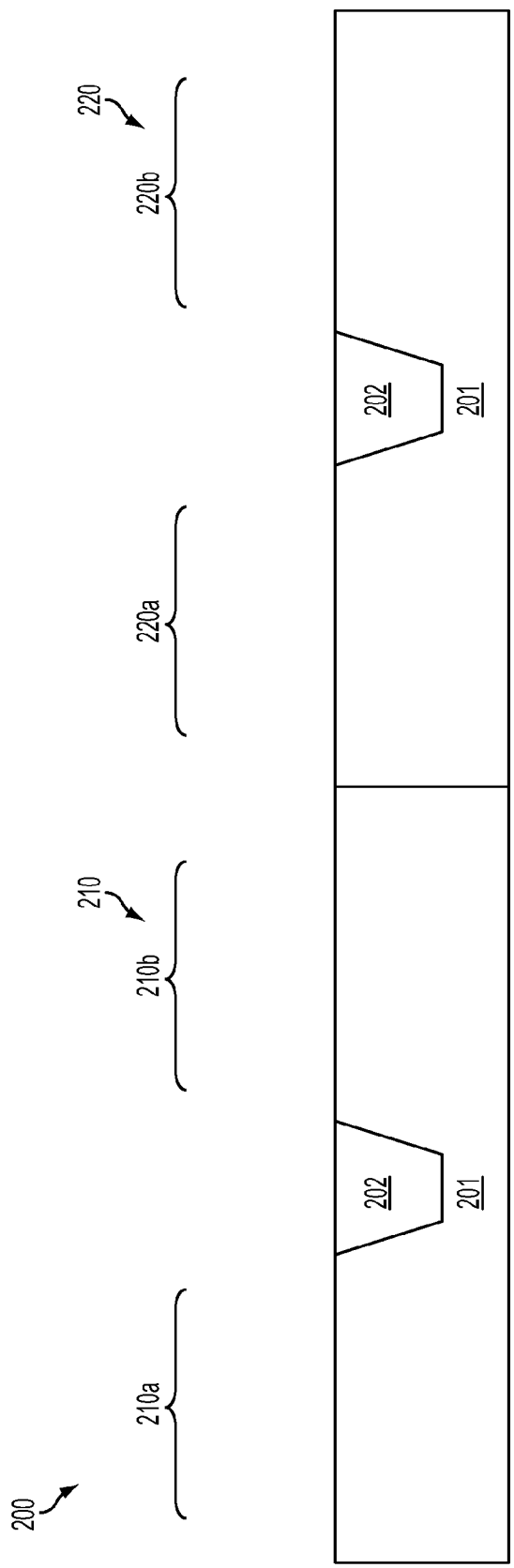
FIGS. 2-11 are various diagrammatic cross-sectional views of an embodiment of an integrated circuit device during various fabrication stages according to the method of FIG. 1.

Referring to FIGS. 1 and 2, the method 100 begins at step 102, wherein a substrate 201 is provided. In the present embodiment, the substrate 201 is a semiconductor substrate comprising silicon. Alternatively, the substrate 201 comprises an elementary semiconductor including silicon and/or germanium in crystal; a compound semiconductor including silicon carbide, gallium arsenide, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. The alloy semiconductor substrate may have a gradient SiGe feature in which the Si and Ge composition change from one ratio at one location to another ratio at another location of the gradient SiGe feature. The alloy SiGe may be formed over a silicon substrate. The SiGe substrate may be strained. Furthermore, the semiconductor substrate may be a semiconductor on insulator (SOI). In some embodiments, the semiconductor substrate may include a doped epi layer. In other embodiments, the silicon substrate may include a multilayer compound semiconductor structure.

The substrate 201 may include various doped regions depending on design requirements (e.g., p-type wells or n-type wells). The doped regions may be doped with p-type dopants, such as boron or $BF_2$; n-type dopants, such as phosphorus or arsenic; or a combination thereof. The doped regions may be formed directly in the substrate 201, in a P-well structure, in an N-well structure, in a dual-well structure, or using a raised structure. The semiconductor device 200 may include a PFET device and/or a NFET device, and thus, the substrate 201 may include various doped regions configured for the PFET device and/or the NFET device.

The substrate 201 may include a device region 210 and an input/output (I/O) region 220. The device region 210 is preserved for forming a core device therein and the I/O region 220 is preserved for forming an I/O circuit therein. The device region 210 includes a N-type transistor (NMOS) device 210a and a P-type transistor (PMOS) device 210b, and the I/O region includes a N-type transistor (NMOS) device 220a and a P-type transistor (PMOS) device 220b, over the substrate 201.

Shallow trench isolation (STI) structures 202 are formed in the substrate 201. The STI structure 202 comprises silicon oxide, silicon nitride, silicon oxynitride, other suitable materials, or combinations thereof. In at least one embodiment, forming the STI structure 202 includes an etching process to form a trench in the substrate 201, and filling the trench with one or more dielectric materials. In some embodiments, the filled trench may have a multi-layered structure, such as a thermal oxide liner layer filled with silicon nitride or silicon oxide.

Figure 3:
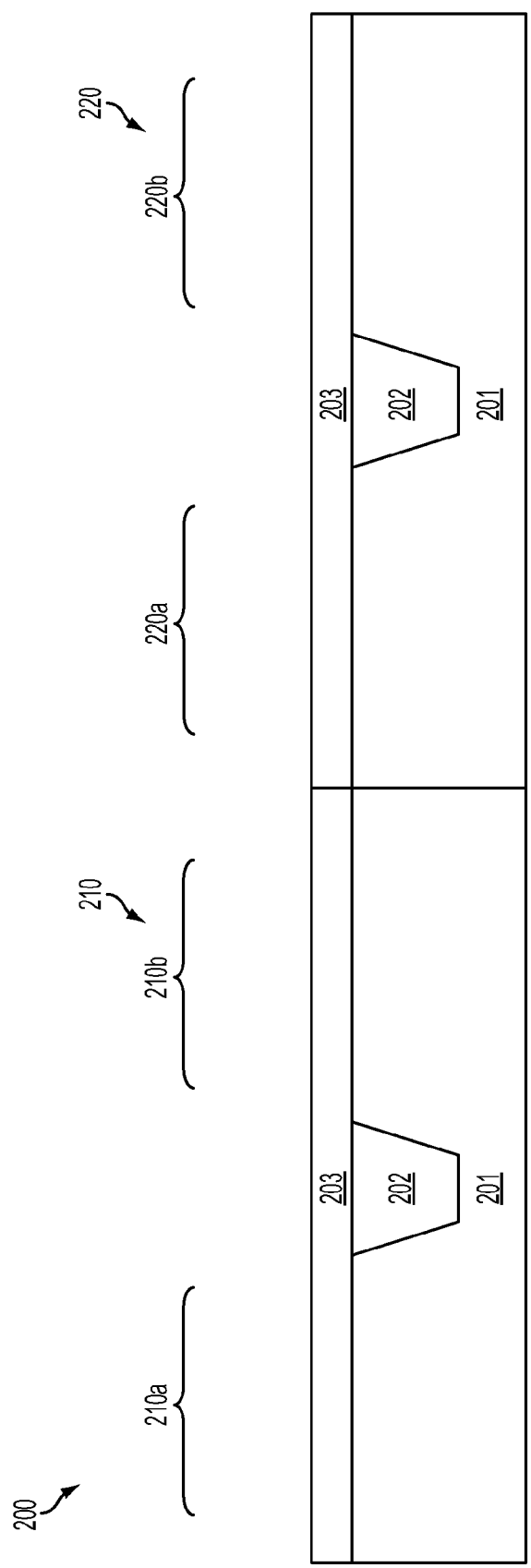

Referring to FIGS. 1 and 3, the method 100 continues with step 104 in which a dielectric layer 203 is formed over the substrate 201 and the STI structures 202. In at least one embodiment, the dielectric layer 203 is formed using a thermal process, such as furnace process, rapid thermal annealing (RTA) process, and/or in-situ steam generation (ISSG) process. In other embodiment, the dielectric layer 203 is formed using a chemical vapor deposition (CVD) process, such as low-pressure chemical vapor deposition (LPCVD) process. In at least one embodiment, the dielectric layer 203 comprises a material of silicon oxide, silicon oxynitride, silicon nitride, or combinations thereof. In other embodiments, the dielectric layer 203 is silicon oxide. In at least one embodiment, the dielectric layer 203 has a thickness ranging between about 20 Angstroms and about 50 Angstroms. In other embodiments, the dielectric layer 203 has a thickness ranging between about 25 Angstroms and about 35 Angstroms.

Figure 4:
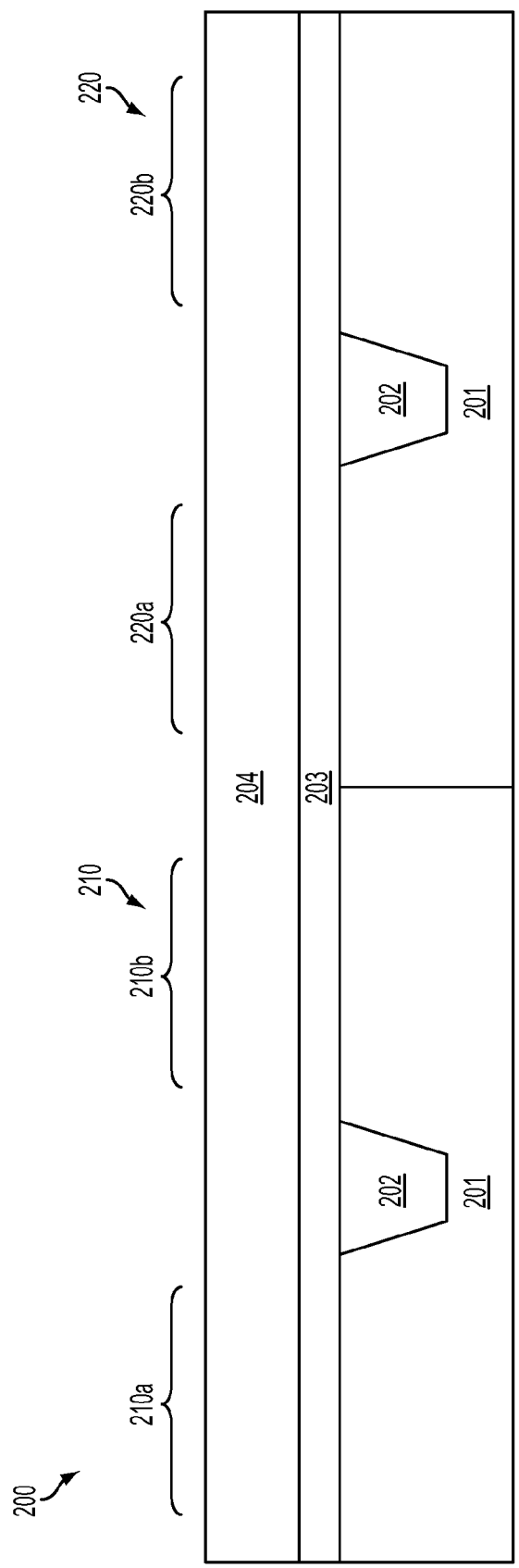

Referring to FIGS. 1 and 4, the method 100 continues with step 106 in which a sacrificial gate layer 204 is formed over the dielectric layer 203. In some embodiments, the sacrificial gate layer 204 is a polycrystalline silicon (polysilicon) layer. The polysilicon layer may be doped for proper conductivity. Alternatively, the polysilicon is not necessarily doped if a sacrificial gate is to be formed and replaced in a subsequent gate replacement process. Alternatively, the sacrificial gate layer 204 is amorphous silicon or other material that has a desired etch rate with respect to the underlying dielectric layer 203, and spacers formed subsequently. The sacrificial gate layer 204 can be formed by deposition, including CVD, ALD, other suitable methods, and/or combinations thereof.

Figure 5:
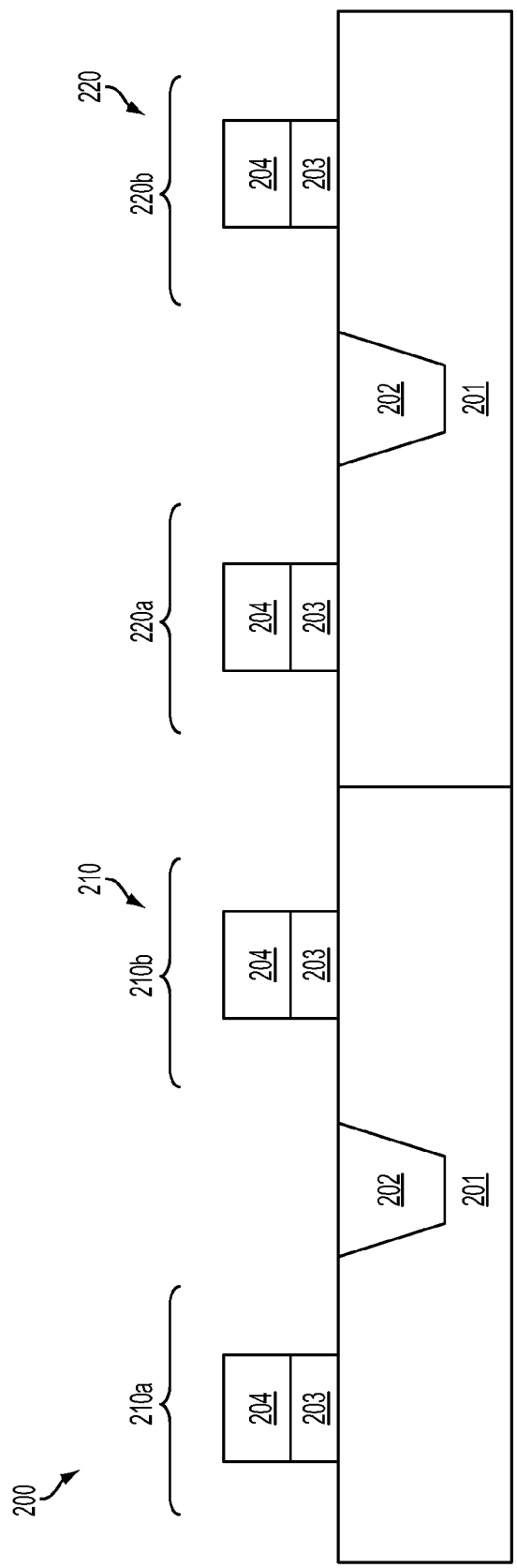

Referring to FIGS. 1 and 5, the method 100 continues with step 108 in which a patterning process is applied to the sacrificial gate layer 204 and the underlying dielectric layer 203. The patterned sacrificial gate layer 204 and the underlying dielectric layer 203 form gate stacks for the NMOS device 220a and PMOS device 220b in the I/O region 220, and form gate stacks for the NMOS device 210a and PMOS device 210b in the device region 210. The patterning process, for example, includes forming a layer of photoresist (not shown) over the sacrificial gate layer 204 by a suitable process, such as spin-on coating, and then exposing and developing the layer of photoresist to form a photoresist feature. Then, a pattern of the photoresist feature can be transferred to the underlying sacrificial gate layer 204 and the dielectric layer 203 to form the gate stacks by a dry etching process. Additionally, an anti-reflective coating (ARC) layer (not shown) may be formed under the layer of photoresist to enhance a subsequent patterning process as known in the art. The photoresist feature may be stripped thereafter. It is understood that the above embodiments do not limit the processing steps that may be utilized to form the gate stacks.

Figure 6:
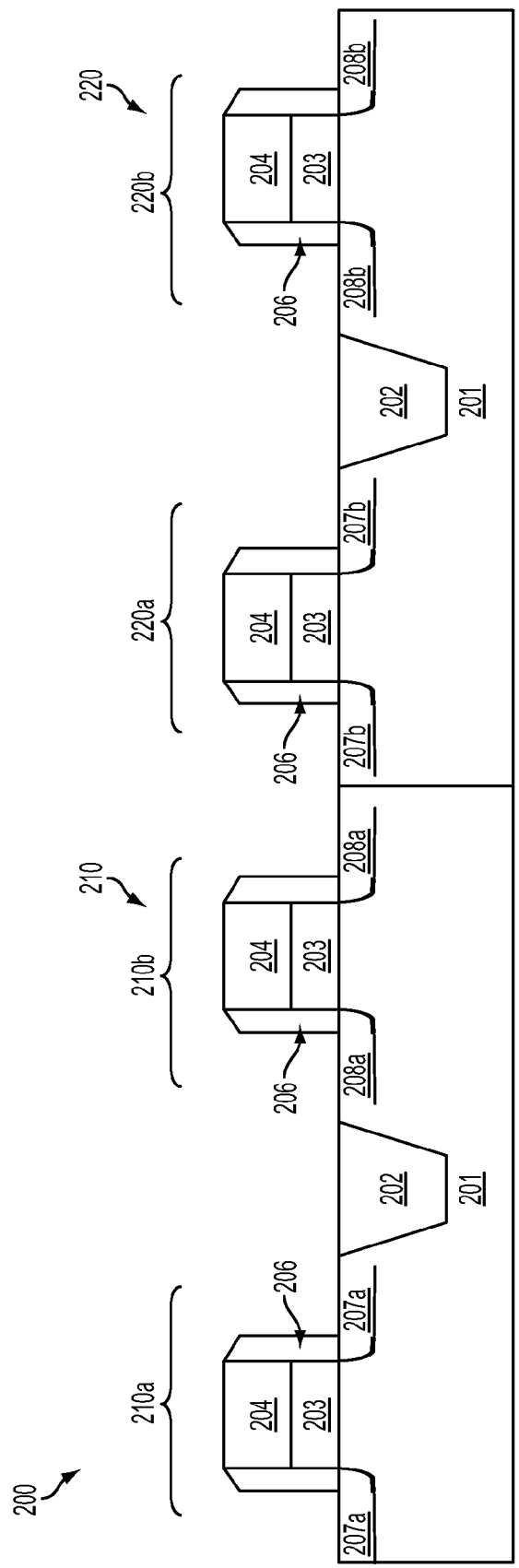

Referring to FIGS. 1 and 6, the method 100 continues with step 110 in which N-type lightly doped source/drain (NLDD) regions 207a, 207b and P-type lightly doped source/drain (PLDD) regions 208a, 208b are formed in the substrate 201. The NLDD regions 207a and 207b are substantially aligned with edges of the gate stacks for the NMOS devices 210a and 220a, respectively. The region in the substrate 201 and between the NLDD regions 207a is identified as a channel of the gate stack for the NMOS devices 210a, and the region in the substrate 201 and between the NLDD regions 207b is identified as a channel of the gate stack for the NMOS devices 220a. The PLDD regions 208a and 208b are substantially aligned with edges of the gate stacks for the PMOS devices 210b and 220b, respectively. The region in the substrate 201 and between the PLDD regions 208a is identified as a channel of the gate stack for the PMOS devices 210b, and the region in the substrate 201 and between the PLDD regions 208b is identified as a channel of the gate stack for the PMOS devices 220b.

The NLDD regions 207a, 207b and PLDD regions 208a, 208b may be formed by ion implantation, plasma-based ion implantation, gaseous or solid source thermal diffusion, deposition, or combinations thereof. In at least one embodiment, the NLDD regions 207a, 207b are doped with an N-type dopant, such as phosphorous and/or arsenic. In other embodiments, the PLDD regions 208a, 208b are doped with a P-type dopant, such as boron and/or $BF_2$.

Still referring to FIGS. 1 and 6, the method 100 continues with step 112 in which spacers 206 are formed adjoining sidewalls of the gate stacks of the NMOS devices 210a, 220a and the PMOS devices 210b, 220b. In some embodiments, spacers 206 may be formed by blanket depositing a dielectric spacer layer (not shown), such as a silicon nitride layer, over the NMOS devices 210a, 220a and the PMOS devices 210b, 220b, and then the dielectric layer is anisotropically etched to form the spacers 206. Alternatively, liners (not shown) may be included under the spacers 206 by forming a dielectric liner layer, e.g., a silicon oxide layer, under the spacer layer, and then the spacer layer and the liner layer are etched in sequence to form the spacers 206 and the underlying liners. In still another embodiment, the spacers 206 may include other dielectric materials, such as silicon oxide, silicon oxynitride, or combinations thereof.

Figure 7:
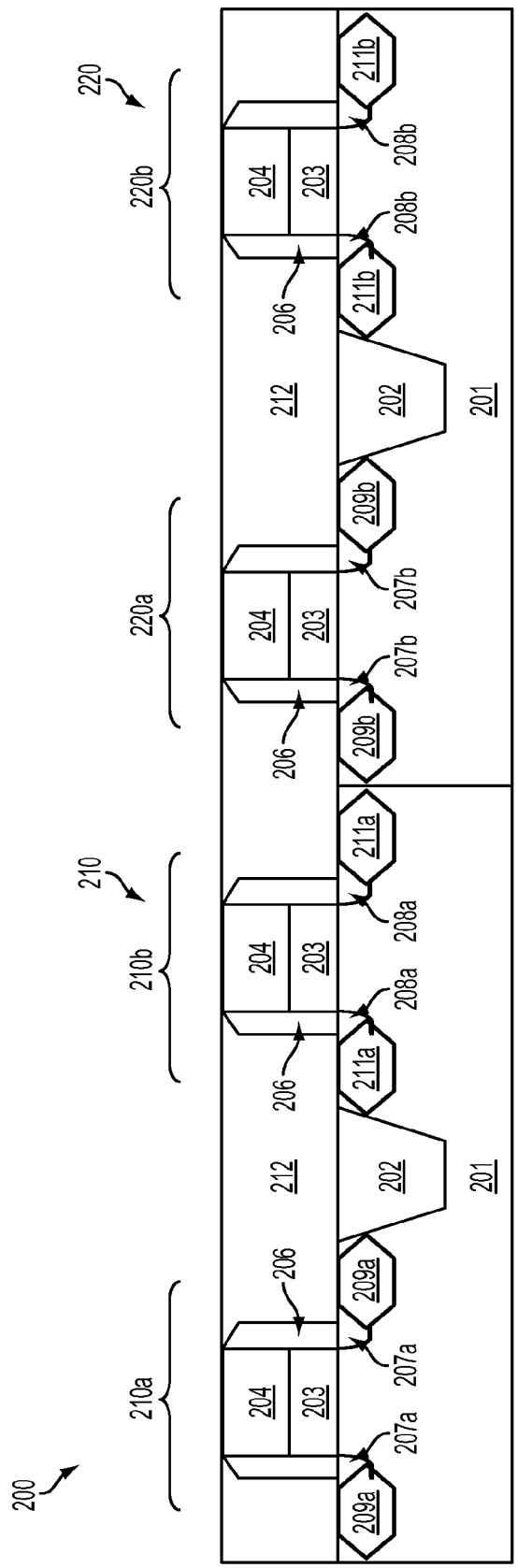

Referring to FIGS. 1 and 7, the method 100 continues with step 114 in which source/drain (S/D) regions 209a, 209b, 211a, and 211b are formed in the substrate 201. In some embodiments, each of the S/D regions 209a, 209b is formed adjacent to the NLDD regions 207a, 207b, respectively, and each of the S/D regions 211a, 211b is formed adjacent to PLDD regions 208a, 208b, respectively. In some embodiments, the S/D regions 209a, 209b, 211a, and 211b can include silicide (not shown) thereon for low resistances.

In some embodiments, the S/D regions 209a, 209b are n-type S/D regions comprising dopants such as Arsenic (As), Phosphorus (P), other group V elements, or the combinations thereof. The S/D regions 209a, 209b may be formed by performing one or more implantation processes to the substrate 201, or filling, epitaxially, features in the substrate 201. In the depicted embodiment, the S/D regions 209a, 209b include epitaxially grown silicon (epi Si) features. The epi Si S/D features may be in-situ doped or undoped during the epi process. For example, the epi Si S/D features may be doped with phosphorous to form Si:P S/D features or doped with carbon to form Si:C S/D features. In some embodiments, the S/D regions 211a, 211b are p-type S/D regions comprising dopants such as Boron (B) or other group III elements. In the depicted embodiment, the S/D regions 211a, 211b include silicon germanium (SiGe) S/D features formed by an epi process. The SiGe S/D features may be in-situ doped or undoped during the epi process.

When the S/D features are undoped, it is understood that they may be doped in a subsequent process. The doping may be achieved by an ion implantation process, plasma immersion ion implantation (PIII) process, gas and/or solid source diffusion process, other suitable process, or combinations thereof. The S/D features may further be exposed to annealing processes, such as a rapid thermal annealing process.

Still referring to FIGS. 1 and 7, the method 100 continues with step 116 in which an interlayer dielectric (ILD) layer 212 is filled in the space within and over the gate stacks for the NMOS device 210a, PMOS device 210b, NMOS device 220a, and PMOS device 220b. In some embodiments, a chemical mechanical polishing (CMP) process is further applied to planarize the ILD layer 212. Further, a contact etch stop layer (CESL) (not shown) may be formed before forming the ILD layer. In some embodiments, the ILD layer 212 is a dielectric layer comprising materials such as oxide, nitride, oxynitride, low-k dielectric material, ultra low-k dielectric material, extreme low-k dielectric material, other dielectric material, and/or combinations thereof. The ILD layer 212 may be formed by, for example, a CVD process, a HDP CVD process, a HARP, a spin-coating process, other deposition process, and/or any combinations thereof. In some embodiments, an additional dielectric layer (not shown) can be formed below or over the ILD layer 212.

FIGS. 8-11 illustrate gate replacement processes for forming a subsequent high-k gate dielectric and metal gate electrode. The depicted processes are cataloged as a gate-last technique which forms the metal gate electrode after the formation of source/drain regions of the transistors.

Figure 8:
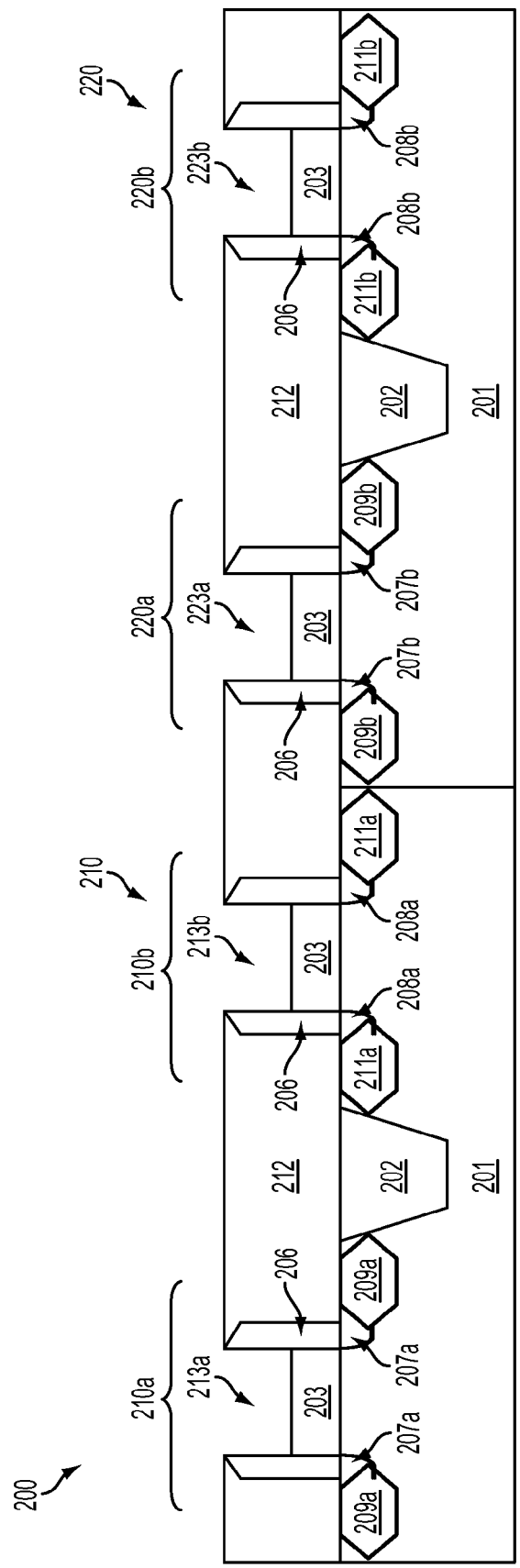

Referring to FIGS. 1 and 8, the method 100 continues with step 118 in which the sacrificial gate layer 204 is removed from the gate stacks for the NMOS devices 210a, PMOS device 210b in the device region 210, and NMOS devices 220a, PMOS device 220b in the I/O region 220. The removing step forms openings 213a, 213b in the ILD layer 212 of the device region 210, and forms openings 223a, 223b in the ILD layer 212 of the I/O region 220. In some embodiments, the removing process comprises a dry and/or wet etching process. In at least one embodiment, the removing process is a dry etching process. The dry etching process, for example, is performed by using an etching gas, comprising $NF_3$, $CF_4$, $CH_2F_2$, $Cl_2$, HBr, $SF_6$, or combinations thereof, with a gas flow rate ranging between about 5 standard cubic centimeter per minute (sccm) and about 300 sccm. The dry etching process may be performed in a transformer coupled plasma (TCP) etcher, with a power ranging between about 300 watts (W) and about 1000 W, with a bias ranging between about 0 V and about 300 V, and at a temperature ranging between about 23° C. and about 70° C. In other embodiments, the removing process is a wet etching process. The wet etching process, for example, is performed by using a chemical, comprising tetramethylammonium hydroxide (TMAH), $NH_4OH$, or a mixture thereof. TMAH and $NH_4OH$ may have a concentration of about 15%-20% and 5%-50%, respectively. The wet etching process may be performed at a temperature ranging between about 23° C. and about 70° C. The removing process has a high etching selectivity to the underlying dielectric layer 203, therefore, the underlying dielectric layer 203 is not substantially removed during removing the sacrificial gate layer 204. The dielectric layer 203 in the openings 223a, 223b, 213a, and 213b are then exposed after removing the sacrificial gate layer 204.

Figure 9:
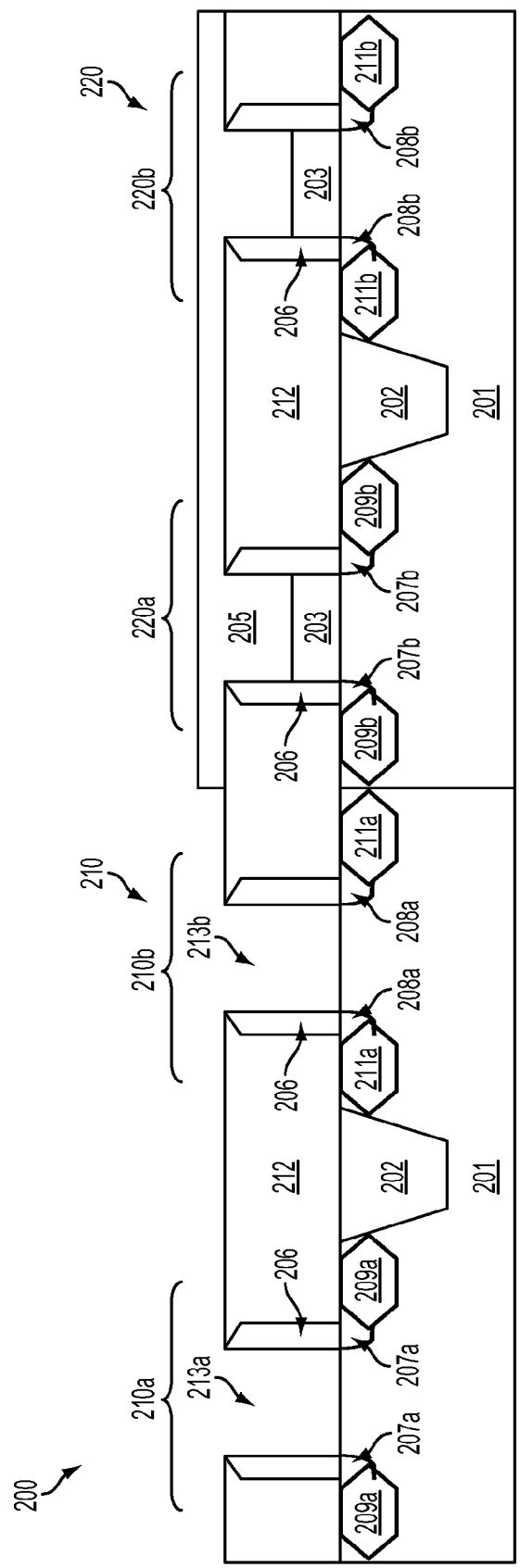

Referring to FIGS. 1 and 9, the method 100 continues with step 120 in which a protector 205 is formed over the dielectric layer 203 in the I/O region 220. In some embodiments, the dielectric layer 203 in the device region 210 is exposed without being covered by the protector 205. The protector 205 may protect the dielectric layer 203 in the I/O region 220 from being removed during a subsequent removing step. The protector 205, e.g., photoresist or hard mask layer, may be formed by a suitable process, such as forming a layer of photoresist (not shown), and then exposing and developing the layer of photoresist to form a photoresist feature.

Still referring to FIGS. 1 and 9, the method 100 continues with step 122 in which a removing process is provided to remove the dielectric layer 203 in the openings 213a, 213b of the device region 210. The removing process, for example, is a dry etching and/or wet etching process. In at least one embodiment, the dielectric layer 203 is removed using a chemical, comprising HF solution, dilute HF solution (DHF), buffered oxide etch (BOE) solution, or vapor HF. In some embodiments, the ratio of HF to de-ionized water in the dilute HF solution is about 1:50. A high etching selectivity is achieved between the dielectric layer 203 and the underlying substrate 201, therefore the substrate 201 in the openings 213a, 213b is not substantially removed during the etching process. As mentioned above, the portion of the dielectric layer 203 in the I/O region 220 is covered by the protector 205. Therefore, the portion of the dielectric layer 203 in the I/O region 220 is not attacked by the etching process. Hence, damage to the dielectric layer 203 in the I/O region 220 caused by the etching process can be prevented. Further, thickness and uniformity of the dielectric layer 203 in the I/O region 220 can be controlled precisely.

Figure 10:
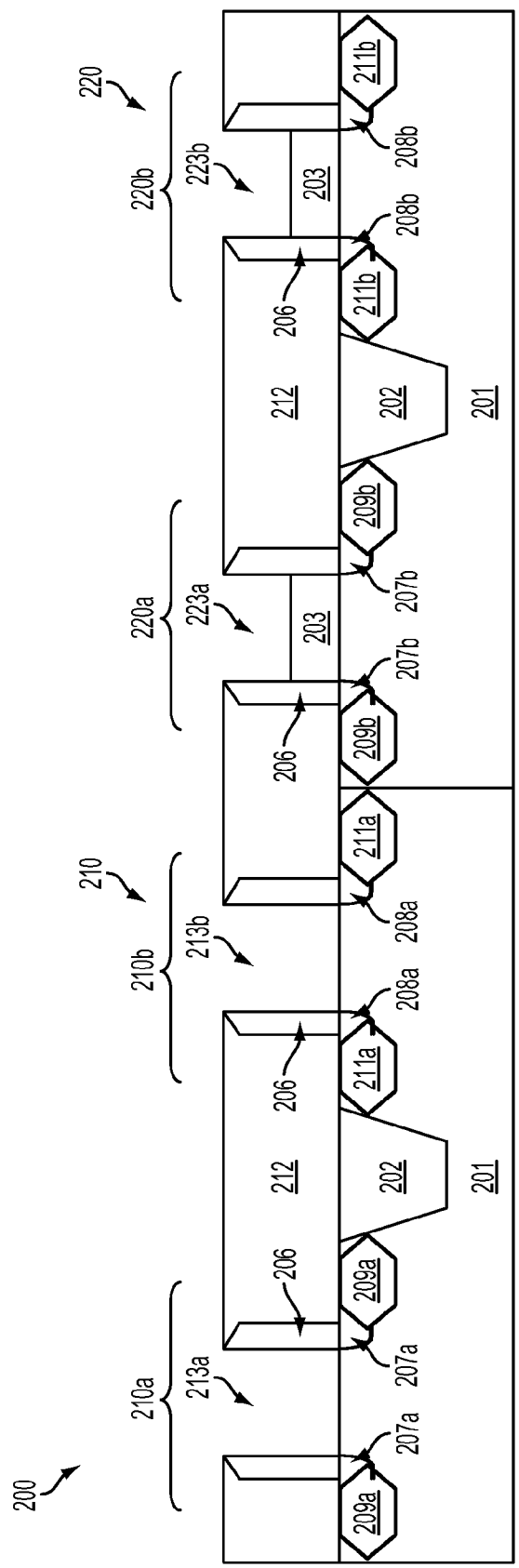

Referring to FIGS. 1 and 10, the method 100 continues with step 124 in which the protector 205 is removed. The removing process, for example, is a dry etching and/or wet etching process. In some embodiments, the removing process is a stripping process or an ashing process using oxygen or oxygen-containing gas. Thereafter, a cleaning process may be provided. In the present embodiment, the cleaning process utilize a cleaning solution comprising SPM ($H_2SO_4$ and $H_2O_2$) performed at a temperature ranging between about 80° C. and about 250° C.

Figure 11:
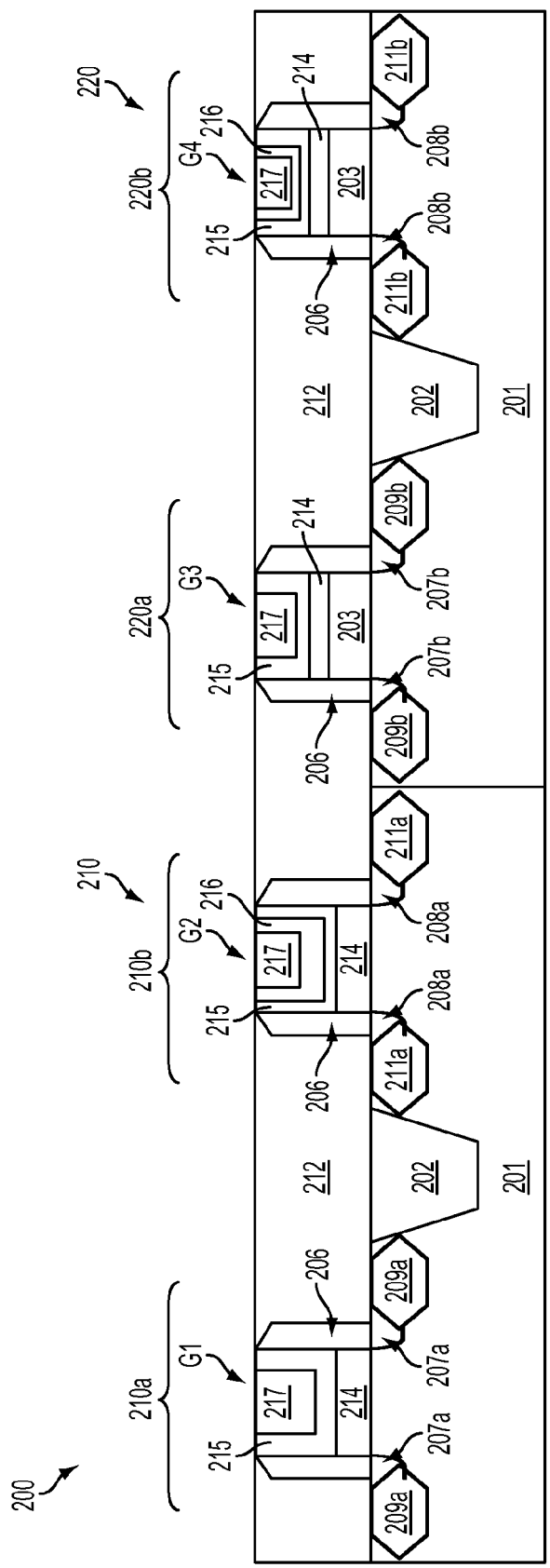

Referring to FIGS. 1 and 11, the method 100 continues with step 126 in which a gate dielectric layer 214 is formed in the openings 213a, 213b, 223a, and 223b. In the device region 210, the gate dielectric layer 214 is formed over the substrate 201. In the I/O region 220, the gate dielectric layer 214 is formed over the dielectric layer 203. Gate electrodes G1 and G2 may be formed over the gate dielectric layer 214 for the NMOS device 210a and the PMOS device 210b, respectively, in the device region 210. Gate electrodes G3 and G4 may be formed over the gate dielectric layer 214 for the NMOS device 220a and the PMOS device 220b, respectively, in the I/O region 210.

In some embodiments, the gate dielectric layer 214 is a high-k dielectric layer disposed over an interfacial layer (not shown). In some embodiments, the gate dielectric layer 214 may include hafnium oxide ($HfO_2$), hafnium silicon oxide (HfSiO), hafnium silicon oxynitride (HfSiON), hafnium tantalum oxide (HfTaO), hafnium titanium oxide (HfTiO), hafnium zirconium oxide (HfZrO), other suitable high-k dielectric materials, and/or combinations thereof. The gate dielectric layer 214 may further be selected from metal oxides, metal nitrides, metal silicates, transition metal-oxides, transition metal-nitrides, transition metal-silicates, oxynitrides of metals, metal aluminates, zirconium silicate, zirconium aluminate, silicon oxide, silicon nitride, silicon oxynitride, zirconium oxide, titanium oxide, aluminum oxide, hafnium dioxide-alumina ($HfO_2$—$Al_2O_3$) alloy, other suitable materials, and/or combinations thereof. The gate dielectric layer 214 may be formed by any suitable process, such as atomic layer deposition (ALD), chemical vapor deposition (CVD), physical vapor deposition (PVD), remote plasma CVD (RPCVD), plasma enhanced CVD (PECVD), metal organic CVD (MOCVD), sputtering, plating, other suitable processes, and/or combinations thereof.

In some embodiments, the gate electrodes G1, G2, G3, and G4 are metal gates. In some embodiments, the gate electrodes G1, G3 include a first work function metallic layer 215 and the first work function metallic layer 215 is configured to adjust a work function value of the gate electrodes G1, G3. The first work function metallic layer 215, for example, is an n-type work function metallic layer. In some embodiments, the gate electrodes G2, G4 include a second work function metallic layer 216 over the first work function metallic layer 215. The second work function metallic layer, for example, is a p-type work function metallic layer. The first and the second work function metallic layers 215, 216 can form a combined work function to adjust a work function value of the gate electrodes G2, G4.

The first work function metallic layer 215 can include materials such as metal, metal carbide, metal nitride, or other suitable materials. In some embodiments, the first work function metallic layer 215 can include materials such as hafnium, zirconium, titanium, tantalum, aluminum, metal carbides, other suitable materials, or the combinations thereof. In other embodiments, the first work function metallic layer 215 can include TiAl. The first work function metallic layer 215 is capable of providing a work function value of about 4.3 eV or less.

The second work function metallic layer 216 can include materials such as metal, metal carbide, metal nitride, other materials that can provide a desired work function for transistors. In some embodiments, the second work function metallic layer 216 can include a conductive metal, such as ruthenium, palladium, platinum, cobalt, nickel, conductive metal oxides, e.g., ruthenium oxide, other suitable materials, or the combinations thereof. In other embodiments, the second work function metallic layer 216 can include TiN. The second work function metallic layer 216 is capable of providing a work function value of about 5 eV or more.

In some embodiments, conductor structures 217 are formed over the gate electrodes G1, G2, G3, and G4. The conductor structures 217 can be configured to provide an electrical transmission. The conductor structures 217 can include structures, such as lines, bulks, plug, and/or other shape of structures. The conductor structures 217 can include metal (e.g., Al) or silicide such as nickel silicide (NiSi), nickel-platinum silicide (NiPtSi), nickel-platinum-germanium silicide (NiPtGeSi), nickel-germanium silicide (NiGeSi), ytterbium silicide (YbSi), platinum silicide (PtSi), iridium silicide (IrSi), erbium silicide (ErSi), cobalt silicide (CoSi), titanium silicide (TiSi), other suitable materials, and/or the combinations thereof.

Thereafter, the semiconductor device 200 continues with processing to complete fabrication as discussed briefly below. For example, a multilayer interconnection (MLI) including metal layers and inter-metal dielectric (IMD) is formed over the substrate to electrically connect various features or structures of the semiconductor device. The multilayer interconnection includes vertical interconnects, such as conventional vias or contacts, and horizontal interconnects, such as metal lines. The various interconnection features may implement various conductive materials including copper, tungsten and silicide. In at least one embodiment, a damascene process is used to form a copper multilayer interconnection structure.

In summary, the disclosed methods and integrated circuit devices result in improved device performance, including but not limited to, improved control over a surface roughness of the dielectric layer in the I/O region by preventing the dielectric layer in the I/O region being damaged during removal of the dielectric layer in the device region. Further, a thickness of the dielectric layer in the I/O region can be precisely controlled, which may simplify the process flow. It is understood that different embodiments may have different advantages, and that no particular advantage is necessarily required of any embodiment.

In one embodiment, a method comprises providing a substrate having a first region and a second region; forming a dielectric layer over the substrate in the first region and the second region; forming a sacrificial gate layer over the dielectric layer; patterning the sacrificial gate layer and the dielectric layer to form gate stacks in the first and second regions; forming an ILD layer within the gate stacks in the first and second regions; removing the sacrificial gate layer in the first and second regions; forming a protector over the dielectric layer in the first region; and thereafter removing the dielectric layer in the second region.

In another embodiment, a method comprises providing a substrate having a first region and a second region; forming an ILD layer in the first region and the second region over the substrate; forming a first opening and a second opening in the ILD layer, the first opening having a first dielectric in the first region and the second opening having a second dielectric in the second region, wherein the first dielectric and the second dielectric have substantially the same thickness; forming a protector over the first dielectric; thereafter removing the second dielectric; removing the protector; and forming a high-k dielectric layer over the substrate in the second region and over the first dielectric in the first region.

In still another embodiment, a method comprises providing a substrate having a device region and an I/O region; forming an oxide layer over the substrate; forming a polysilicon layer over the oxide layer; patterning the polysilicon layer and the oxide layer to form gate stacks in the device and I/O regions; forming an ILD layer within the gate stacks in the device and I/O regions; removing the polysilicon layer to form openings in the device and I/O regions; forming a protector over the oxide layer in the I/O region; removing the oxide layer in the device region; removing the protector; forming a high-k gate dielectric in the openings of device region and I/O region; and forming a metal gate electrode over the high-k gate dielectric.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
   forming a dielectric layer over a substrate having a first region and a second region, the dielectric layer being formed at least in the first region and the second region;
   forming a sacrificial gate layer over the dielectric layer;
   patterning the sacrificial gate layer and the dielectric layer to form gate stacks in the first and second regions;
   forming an ILD layer within the gate stacks in the first and second regions;
   removing, in a single step, the sacrificial gate layer in the first and second regions;
   forming a protector over the dielectric layer in the first region;

removing the dielectric layer in the second region; and forming a high-k dielectric layer in the first and second regions after removing the dielectric layer in the second region, wherein the high-k dielectric layer in the first region is formed over the dielectric layer in the first region.

2. The method of claim 1, wherein the first region is an I/O region and the second region is a device region.

3. The method of claim 1, wherein the dielectric layer is silicon oxide.

4. The method of claim 1, wherein the dielectric layer has a thickness ranging between about 20 Angstroms and about 50 Angstroms.

5. The method of claim 1, wherein the protector is a photoresist pattern.

6. The method of claim 1, wherein the step of removing the dielectric layer in the second region is performed by using HF solution, dilute HF solution (DHF), buffered oxide etch (BOE) solution, or vapor HF.

7. The method of claim 1, further comprising removing the protector after the step of removing the dielectric layer in the second region.

8. The method of claim 7, wherein the protector is removed by a stripping process using an oxygen-containing gas.

9. The method of claim 7, further comprising performing a cleaning process after removing the protector.

10. A method comprising:

forming an oxide layer over a substrate having a device region and an I/O region, the oxide layer being formed at least in the device region and the I/O region;

forming a polysilicon layer over the oxide layer;

patterning the polysilicon layer and the oxide layer to form gate stacks in the device and I/O regions;

forming an ILD layer within the gate stacks in the device and I/O regions;

removing, in a single step, the polysilicon layer to form openings in the device and I/O regions;

forming a protector over the oxide layer in the I/O region;

removing the oxide layer in the device region;

removing the protector;

forming a high-k gate dielectric in the openings of the device region and the I/O region; and forming a metal gate electrode over the high-k gate dielectric, wherein the high-k dielectric is formed over the oxide layer in the I/O region.

11. The method of claim 10, wherein the protector is a photoresist pattern.

12. The method of claim 10, wherein the oxide layer has a thickness ranging between about 20 Angstroms and about 50 Angstroms.

13. The method of claim 10, wherein the step of removing the oxide layer in the device region is performed by using HF solution, dilute HF solution (DHF), buffered oxide etch (BOE) solution, or vapor HF.

14. The method of claim 10, further comprising removing the protector after the step of removing the oxide layer in the device region.

15. The method of claim 14, wherein the protector is removed by a stripping process using an oxygen-containing gas.

16. A method comprising:

forming a dielectric layer over a substrate having a first region and a second region, the dielectric layer being formed at least in the first region and the second region;

forming a sacrificial gate layer over the dielectric layer;

patterning the sacrificial gate layer and the dielectric layer to form gate stacks in the first and second regions;

forming an ILD layer within the gate stacks in the first and second regions;

removing, in a single step, the sacrificial gate layer in the first and second regions;

forming a protector over the dielectric layer in the first region;

removing the dielectric layer in the second region;

removing the protector after removing the dielectric layer in the second region; and forming a high-k dielectric layer in the first and second regions after removing the protector, wherein the high-k dielectric layer in the first region is formed over the dielectric layer in the first region.

17. The method of claim 16, wherein the dielectric layer has a thickness ranging between about 20 Angstroms and about 50 Angstroms.

18. The method of claim 16, wherein the step of removing the dielectric layer in the second region is performed by using HF solution, dilute HF solution (DHF), buffered oxide etch (BOE) solution, or vapor HF.

19. The method of claim 16, wherein the protector is removed by a stripping process using an oxygen-containing gas.

20. The method of claim 16, further comprising:

performing a cleaning process after removing the protector.

* * * * *